United States Patent [19]

Yoo et al.

[11] Patent Number: 5,518,954
[45] Date of Patent: May 21, 1996

[54] METHOD FOR FABRICATING A SEMICONDUCTOR LASER

[75] Inventors: Tae K. Yoo, Seoul; Jong S. Kim, Daegujikhal, both of Rep. of Korea

[73] Assignee: Goldstar Co., Ltd., Seoul, Rep. of Korea

[21] Appl. No.: 250,554

[22] Filed: May 27, 1994

[30] Foreign Application Priority Data

Oct. 6, 1993 [KR] Rep. of Korea ............... 20627/1993

[51] Int. Cl.$^6$ ............................................. H01L 21/20
[52] U.S. Cl. ............................................. 437/129
[58] Field of Search .................. 437/129; 148/DIG. 95

Primary Examiner—R. Bruce Breneman
Assistant Examiner—Linda J. Fleck
Attorney, Agent, or Firm—John P. White

[57] ABSTRACT

A semiconductor laser capable of minimizing generation of defects at the interface between grown layers, and a method for fabricating the same. The semiconductor laser is fabricated by forming an n type buffer layer over an n typesemiconductor substrate, forming a first n type clad layer over the buffer layer, forming an active layer over the first clad layer, sequentially growing a first p type clad layer, an etch stop layer, a second p type clad layer, a p type current injection layer, a first p type evaporation-preventing layer and a second p type evaporation-preventing layer, thereby forming a second clad layer, etching the second clad layer, thereby forming a mesa-shaped ridge portion, forming a current shield layer over a portion of the second clad layer exposed upon the etching, etching a portion of the current shield layer disposed over the mesa-shaped ridge portion, thereby forming a current injection region, and exposing a portion of the second evaporation-preventing layer disposed in the current injection region, etching the exposed portion of the second evaporation-preventing layer, thereby exposing a portion of the first evaporation-preventing layer disposed beneath the exposed portion of the second evaporation-preventing layer, and forming a p type cap layer over the entire exposed surface of the resulting structure.

20 Claims, 8 Drawing Sheets

METHOD FOR FABRICATING A SEMICONDUCTOR LASER

BACKGROUND OF THE INVENTION

The present invention relates to a semiconductor laser and a method for fabricating the same, and more particularly to a semiconductor laser ensuring a high output and a method for fabricating the same.

Semiconductor lasers are light sources for optical fiber communication and optical information processing. As compared to other kinds of lasers, the semiconductor lasers exhibit a high efficiency and a capability of a convenient and rapid modulation. In particular, the semiconductor laser have a miniature structure providing a convenience in use.

Depending on materials and compositions used, various semiconductor lasers may be used in a wide wavelength range of emitted light from the visible ray wavelength to the far infrared ray wavelength. Since the semiconductor lasers is ensured to be used for several tens of years, their application to technical fields is extending.

Such semiconductor lasers are classified into a GaAlAs-based laser oscillating at a short wavelength of 0.7 to 0.9 μm and an InGaAsP-based laser oscillating at a long wavelength of 1.1 to 1.6 μm. In terms of structure, a double hetero (DH) structure including n type and p type clad layers and an active layer interposed between the clad layers is known for semiconductor lasers.

Semiconductor lasers having the DH structure are also classified into one of the gain waveguide type and one of the refractive waveguide type. The gain waveguide semiconductor lasers having a stripe DH structure are lasers adapted to confine carriers and optical waves within a narrow active layer in a direction normal to layers grown and thereby guide light to a gain region of high carrier density.

The refractive waveguide semiconductor lasers are lasers adapted to confine optical waves in an active layer in a direction parallel to layers grown and thereby guide light. For these semiconductor lasers, a buried DH structure is mainly used.

The buried DH structure includes a pair of n type clad layers and an active layer interposed between the n type clad layers and has a shape that the active layer is surrounded by the n type clad layers. Since these lasers are constructed to achieve a wave guiding under a condition that the active layer is surrounded vertically and laterally by the clad layers of low refractive index, they are called refractive waveguide lasers.

In fabrication of semiconductor lasers having the DH structure, it is important to grow a thin film having the DH structure constituted by an active layer and n type and p type clad layers, on a substrate. This growth is called an epitaxy.

For such an epitaxy, various methods may be used which include a liquid phase epitaxy (LPE), a metal organic chemical vapor deposition (MOCVD) and a molecular beam epitaxy (MBE).

InGaAlP-based semiconductor lasers are fabricated by use of the MOCVD process because of the material characteristic thereof.

Where a semiconductor laser is fabricated by use of the MOCVD process, a thin film of a DH structure including an active layer and n type and p type clad layers, and a current shield layer are sequentially grown over a substrate using a primary MOCVD process. After etching the current shield layer, a cap layer is grown over the upper clad layer using a secondary MOCVD process.

For fabricating a semiconductor laser of the DH structure, therefore, growth of a thin film is achieved by using the MOCVD process at least two times.

FIG. 1 is a sectional view illustrating a gain waveguide semiconductor laser having an inner stripe structure fabricated by use of a MOCVD process.

As shown in FIG. 1, the semiconductor laser includes an n type GaAs substrate 11, an n type GaAs buffer layer 12 formed over the substrate 11, and a thin film formed over the buffer layer 12 and having a DH structure constituted by an n type InGaAlP clad layer 13, an InGaP active layer 14 and a p type InGaAlP clad layer 15. An n type GaAs current shield layer 16 is disposed on the p type clad layer 15 except for a current injection region A. For covering the current injection region A, a p type GaAs cap layer 17 is disposed over the exposed upper surfaces of the p type clad layer and the n type current shield layer 16.

The buffer layer 12, the n type clad layer 13, the active layer 14 and the p type clad layer 15 constituting the DH structure, and the current shield layer 16 are continuously grown over the n type substrate 11 in accordance with a primary MOCVD process. Meanwhile, the p type cap layer 17 is grown in accordance with a secondary MOCVD process.

Refractive waveguide semiconductor lasers have been also known. The refractive waveguide semiconductor lasers has a superior lateral mode characteristic over the gain waveguide semiconductor lasers. As such refractive waveguide semiconductor lasers, there are a semiconductor laser having a selective buried ridge (SBR) structure as disclosed in Toshiba Review, 45(11), 907 in 1990 and a semiconductor laser having hetero barrier blocking (HBB) structure.

FIGS. 2a to 2e are sectional views respectively illustrating a method for fabrication a refractive waveguide semiconductor laser. Now, this method will be described, in conjunction with FIGS. 2a to 2e.

In accordance with this method, first, an n type GaAs buffer layer 22, an n type InGaAlP clad layer 23, an InGaP active layer 24 and a p type InGaAlP clad layer 25, the latter three layers constituting a DH structure, are continuously grown over an n type GaAs substrate 21 in accordance with a primary MOCVD process, as shown in FIG. 2a.

In this case, the n type clad layer 23 and the active layer 24 and the p type clad layer 25 are formed to have thickness of about 1 μm, about 0.1 μm and about 0.9 μm, respectively.

Over the p type clad layer 25, an insulating film 28 made of $SiO_2$ or $Si_3N_4$ is deposited, as shown in FIG. 2b. The insulating film 28 is then photo-etched so that it may be left on a portion of the p type clad layer 25 corresponding to a current injection region to be formed. The insulating film 28 has a stripe shape. By the photo-etching, the p type clad layer 25 is partially exposed.

Using the insulating film 28 as a mask, the exposed portion of p type clad layer 25 is etched to a predetermined depth, as shown in FIG. 2c. At this time, the etching of the p type clad layer 25 is carried out in a selective manner so as to form a stripe-ridge mesa portion 25-1 corresponding to the current injection region A. The remaining thickness of the p type clad layer 25 at the exposed portion thereof is about 0.25 μm.

Thereafter, an n type GaAs current shield layer 26 is selectively grown over the resulting structure in accordance with a second MOCVD process, as shown in FIG. 2d. The growth of n type GaAs current shield layer 26 is hardly achieved in the current injection region due to the insulating film 28. As a result, the n type GaAs current shield layer 26 is formed only on the exposed p type clad layer 25.

The insulating film 28 is then removed, thereby forming the current injection region A. After removal of the insulating film 28, a p type GaAs cap layer 27 is grown over the resulting structure in accordance with a third MOCVD process. Thus, a semiconductor laser having the SBR structure is obtained.

Since the insulating layer 28 is used as a mask for the selective epitaxy of the current shield layer 26 in accordance with the method of FIGS. 2a to 2e, the semiconductor laser involves a problem of defects formed due to the insulating film 28 present in the current injection region A. As a result, the reliability of the semiconductor laser is degraded.

As the laser is activated, the bad effect caused by the insulating film reaches the interface between the cap layer and the clad layer and the active layer disposed beneath the clad layer.

In accordance with the above-mentioned method, the InGaAlP of the p type clad layer is exposed upon performing the epitaxy for forming the current shield layer 26 by use of the secondary MOCVD process and the epitaxy for forming the p type cap layer 27 by use the third MOCVD process. Due to such an exposure, oxidation of Al and growth condition of GaAs for obtaining a good interface between the InGaAlP layer and the GaAs layer as the cap layer should be taken into consideration.

FIG. 3 is a sectional view illustrating a conventional semiconductor laser having an HBB structure.

As shown in FIG. 3, the semiconductor laser includes an n type GaAs buffer layer 32 formed over the substrate 31, an n type InGaAlP clad layer 33 formed over the n type buffer layer 32, an InGaP active layer 34 formed over the n type clad layer 33 and a p type InGaAlP clad layer 35 formed over the active layer 34. The n type clad layer 33, the active layer 34 and the p type clad layer 35 constitute together a DH structure. The p type clad layer 35 has a stripe-ridge mesa portion 35' in a current injection region A.

A p type InGaP current injection layer 36 is disposed only on the stripe-ridge mesa portion 35' of the p type clad layer 35. A p type GaAs cap layer 37 is disposed over the entire exposed upper surfaces of the p type clad layer 35 and the p type current injection layer 36 so as to cover the p type current injection layer 36.

In the semiconductor laser having the HBB structure, the energy band gap of the GaAs/InGaP/InGaAlP structure formed in the current injection region A and constituted by the cap layer 37, the p type current injection layer 36 and the p type clad layer 35 is stepwise exhibited, as compared to the GaAs/InGaAlP structure formed in a region other than the current injection region A and constituted by the cap layer 37 and the p type clad layer 35. As a result, the energy band gap in the current injection region A is varied smoothly so that most of carrier flows can be confined within the current injection region A.

Fabrication of the above-mentioned semiconductor laser having the HBB structure is carried out in a similar manner to that of the semiconductor laser having the SBR structure.

For fabrication of the semiconductor laser having the HBB structure, first, the n type GaAs buffer layer 32, the n type InGaAlP clad layer 35 and the p type InGaP layer 36, the latter two layers constituting the DH structure, are sequentially grown over the n type GaAs substrate 31 in accordance with a primary MOCVD process. Over the p type InGaP layer 36, an insulating film (not shown) is coated. Thereafter, the insulating film is removed at its portion other than the portion corresponding to the current injection region A, thereby partially exposing the p type InGaP layer 36 as the p type current injection layer.

Using the insulating film as a mask, the exposed portion of p type current injection layer 36 is etched, thereby partially exposing the p type clad layer 35. Thereafter, the exposed portion of p type clad layer 35 is etched to a predetermined depth so as to form the stripe-ridge mesa portion 35'. The portion of p type clad layer 35 subjected to the etching has a thickness of 0.25 μm.

Thereafter, formation of the p type GaAs cap layer 37 on the exposed portion of p type clad layer 35 is carried out using a secondary MOCVD process. As a result, the p type current injection layer 36 is covered by the p type GaAs cap layer 37. Thus, the semiconductor laser having the HBB structure is obtained.

As the mask upon etching the p type clad layer 35, a photoresist film may be used in place of the insulating film.

Since the InGaAlP of the p type clad layer 35 is exposed upon performing the epitaxy for forming the p type GaAs cap layer 37 by use of the secondary MOCVD process, as in the gain waveguide semiconductor laser of FIG. 2, oxidation of Al and growth condition of GaAs for obtaining a good interface between the InGaAlP layer and the GaAs layer should be taken into consideration.

SUMMARY OF THE INVENTION

Therefore, an object of the invention is to provide a semiconductor laser capable of minimizing generation of defects at the interface between grown layers being in contact with each other due to an introduction of an insulating film, and a method for fabricating the same.

In accordance with one aspect, the present invention provides a semiconductor laser comprising: a semiconductor substrate of a first conduction type; a buffer layer of the first conduction type formed over the semiconductor laser; a first clad layer of the first conduction type formed over the buffer layer; an active layer formed over the first clad layer; a second clad layer of a second conduction type formed over the active layer and provided at an upper portion thereof with a mesa-shaped ridge portion defined with a current injection region; a current shield layer of the first conduction type formed on the second clad layer except for the current injection region; and a cap layer of the second conduction type formed over the current shield layer to cover the current injection region.

In accordance with another aspect, the present invention provides a method for fabricating a semiconductor laser, comprising the steps of: forming a buffer layer of a first conduction type over a semiconductor substrate of the first conduction type; forming a first clad layer of the first conduction type over the buffer layer; forming an active layer over the first clad layer; sequentially growing a first second-conduction type clad layer, an etch stop layer, a second second-conduction type clad layer, a current injection layer of the second conduction type, a first evaporation-preventing layer of the second conduction type and a second evaporation-preventing layer of the second conduction type, thereby forming a second clad layer; etching the second clad layer, thereby forming a mesa-shaped ridge portion; forming a current shield layer over a portion of the second clad layer exposed upon the etching; etching a portion of the current shield layer disposed over the mesa-shaped ridge portion, thereby forming a current injection region, and exposing a portion of the second evaporation-preventing layer disposed in the current injection region; etching the exposed portion of the second evaporation-preventing layer, thereby exposing a portion of the first evaporation-preventing layer disposed beneath the exposed portion of the second evaporation-preventing layer; and forming a cap layer of the second conduction type over the entire exposed surface of the resulting structure.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
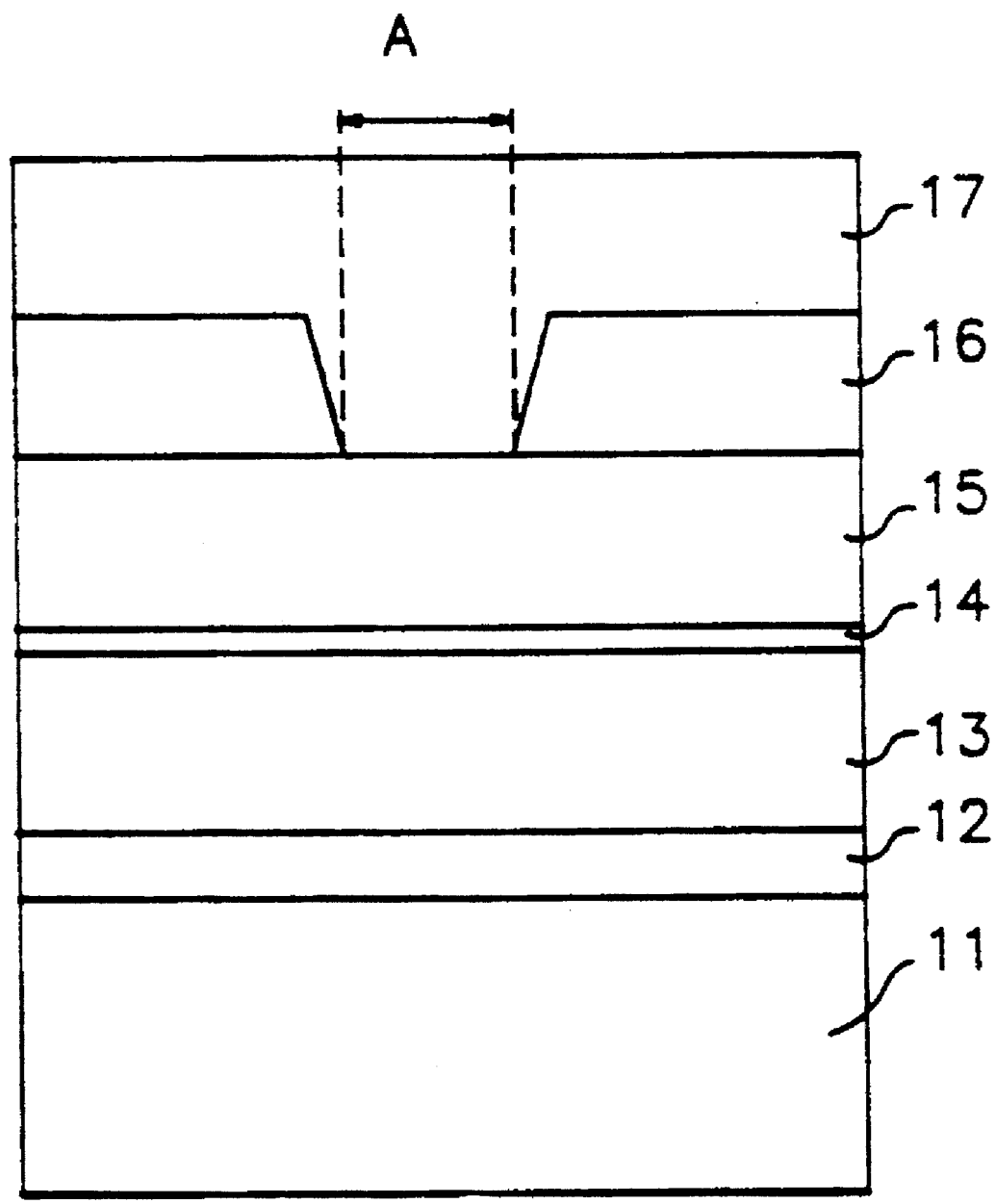
FIG. 1 is a sectional view illustrating a gain waveguide semiconductor laser having an inner stripe structure fabricated by use of a MOCVD process.
Figure 2A:
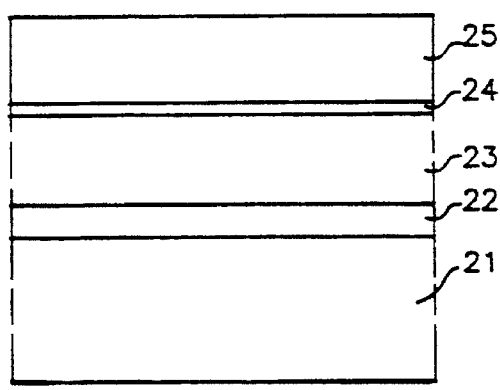
FIGS. 2a to 2e are sectional views respectively illustrating a method for fabrication a refractive waveguide semiconductor laser.
Figure 2B:
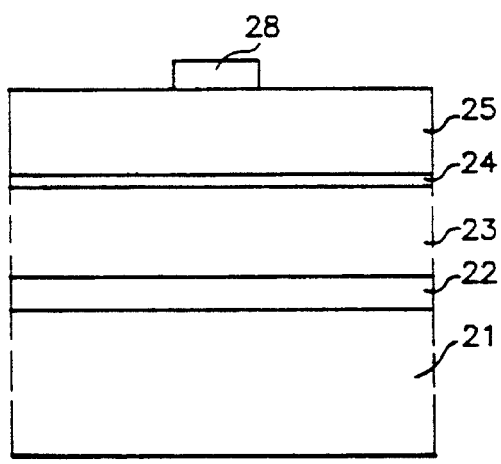
Figure 2C:
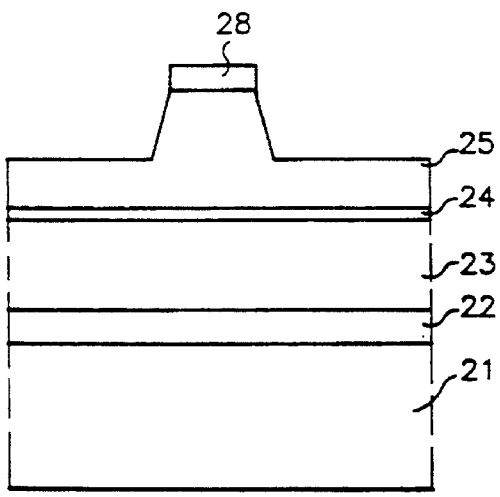
Figure 2D:
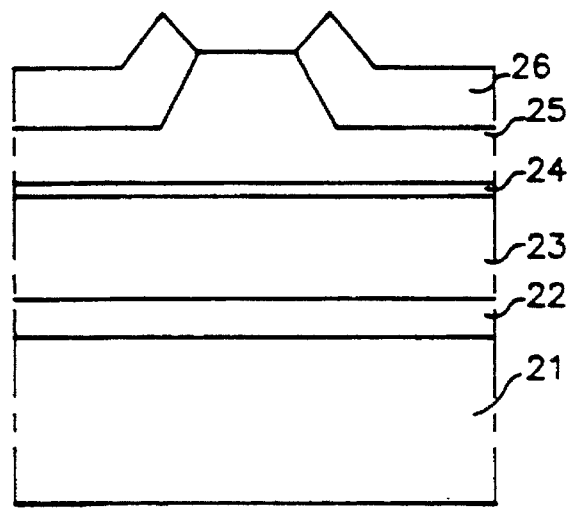
Figure 2E:
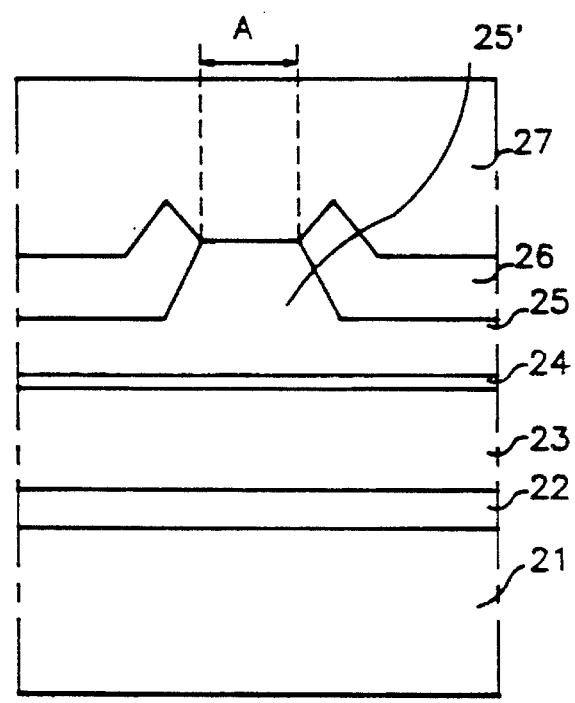
Figure 3:
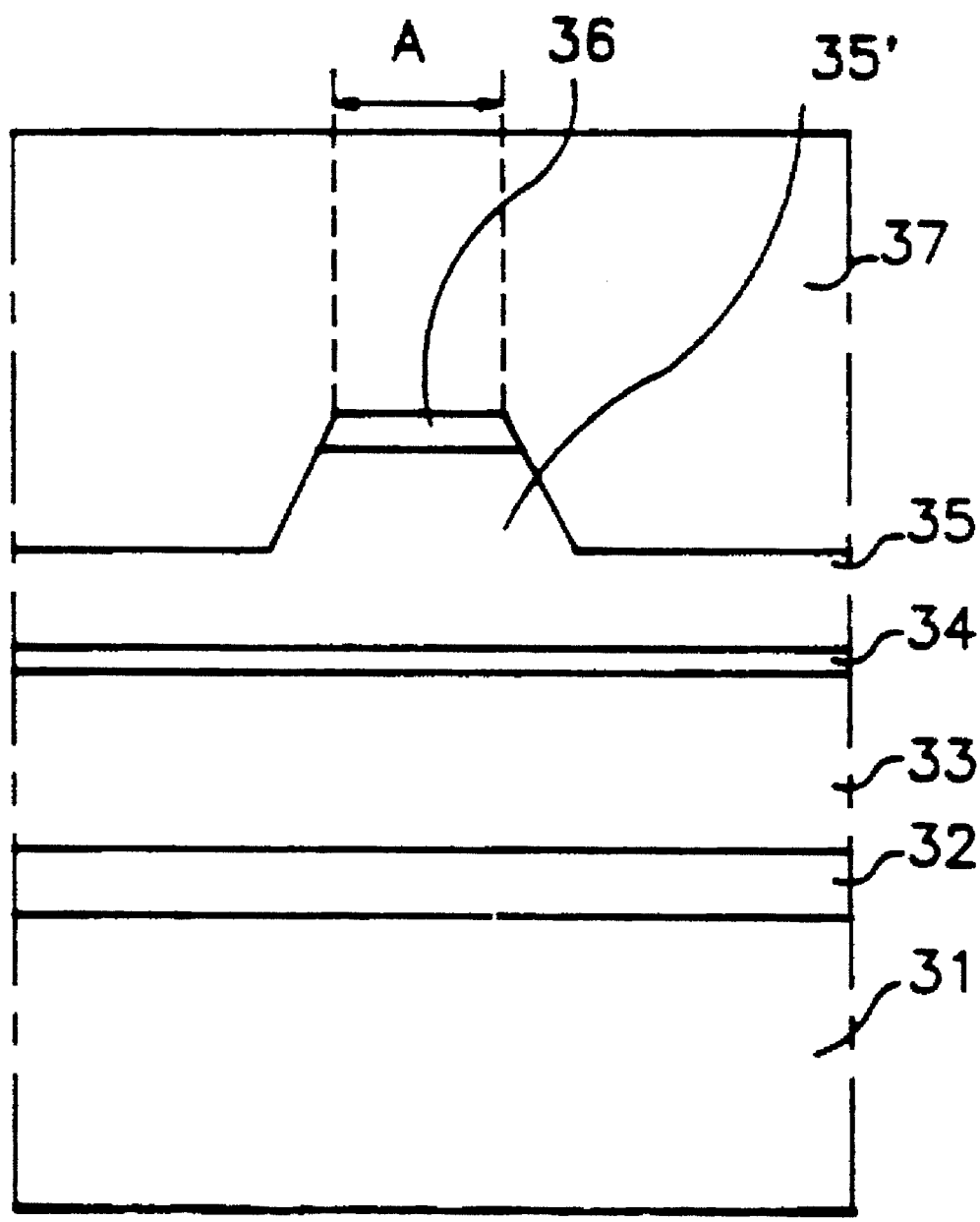
FIG. 3 is a sectional view illustrating a conventional semiconductor laser having an HBB structure.
Figure 4:
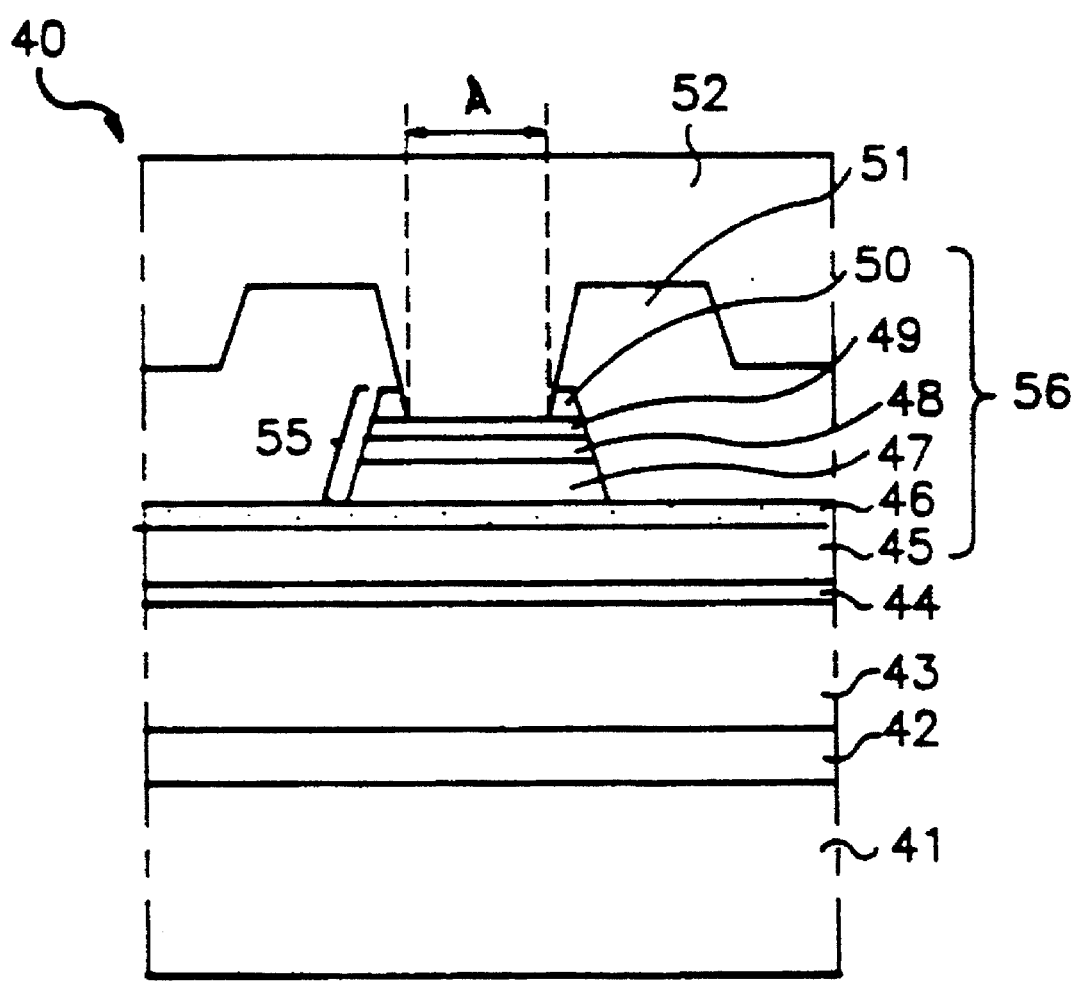
FIG. 4 is a sectional view illustrating a refractive waveguide semiconductor laser in accordance with the present invention.

FIG. 4 is a sectional view illustrating a refractive waveguide semiconductor laser in accordance with the present invention. In FIG. 4, the semiconductor laser is denoted by the reference numeral 40.

The semiconductor laser 40 of the present invention comprises an n type semiconductor substrate 41, an n type buffer layer 42 disposed on the substrate 11, a first clad layer 43 disposed on the buffer layer 42, an active layer 44 disposed on the first clad layer 43 and a second clad layer 56 disposed on the active layer 44. The first clad layer 43, the active layer 44 and the second clad layer 56 constitute together a DH structure.

The n type buffer layer 42 is made of an n type GaAs doped with an n type impurity in a concentration of 5 to $20 \times 10^{17}/cm^3$ and has a thickness of 0.5 μm.

The first clad layer 43 constituting the DH structure is made of an n type In0.5(Ga1−xAlx)5P (0.4 ≦x≦1) doped with an n type impurity in a concentration of 1 to $10 \times 10^{17}/cm^3$ and has a thickness of about 1.0 μm.

The active layer 44 is made of an undoped or p-doped In0.5(Ga1−xAlx)0.5P (0≦x≦0.5) and has a thickness of about 0.05 to about 0.2 μm.

The second clad layer 56 serves as a wave guide channel and has a mesa-shaped ridge portion 55 having an upper surface width of 4 to 7 μm. The second clad layer 56 comprises a first p type clad layer 45 formed over the active layer 44 and an etch stop layer 46 formed over the first p type clad layer 45. The second clad layer 56 further comprises a second p type clad layer 47 constituting the mesa-shaped ridge portion 55, a current injection layer 48 formed over the second p type clad layer 47, a first evaporation-preventing layer 49 formed over the current injection layer 48 and defined with a current injection region A, and a second evaporation-preventing layer 50 formed on the first evaporation-preventing layer 49 except for the current injection region A.

The first p type clad layer 45 is made of an p type In0.5(Ga1−xAlx)0.5P (0.4≦x≦1) doped with an p type impurity in a concentration of 1 to $10 \times 10^{17}/cm^3$ and has a thickness of about 0.6 μm.

The current injection layer 48 serves to reduce the energy band gap generated between the second clad layer 56 and a cap layer which will be described hereinafter. The current injection layer 48 is made of a p type In0.5Ga0.5P and has a thickness of about 0.05 to 1 μm.

The first and second evaporation-preventing layers 49 and 50 are layers for maintaining the entire surface exposed upon growth using secondary and third MOCVD processes, with a single Group V element. The first evaporation-preventing layer 49 is made of a p type GaAs doped with a p type impurity in a concentration of 1 to $10 \times 10^{18}/cm^3$ and has a thickness of about 0.1 μm. The second evaporation-preventing layer 50 is made of a p type In0.5Ga0.5P doped with a p type impurity in a concentration of 1 to $10 \times 10^{18}/cm^3$ and has a thickness of about 0.05 μm.

The current injection region A is a region to which most of current is applied in an oscillating mode of the semiconductor laser 40.

The semiconductor laser 40 further comprises an n type current shield layer 51 disposed on the second clad layer 56 except for the current injection region A, and a p type GaAs cap layer 52 disposed on the n type current shield layer 51 to cover the current injection region A.

The current shield layer 51 is made of an n type GaAs doped with an n type impurity in a concentration of 1 to $5 \times 10^{18}/cm^3$ and has a thickness of about 0.8 to 1.0 μm.

FIGS. 5a to 5g are sectional views respectively illustrating a method for fabricating the semiconductor laser shown in FIG. 4 in accordance with the present invention.

Figure 5A:
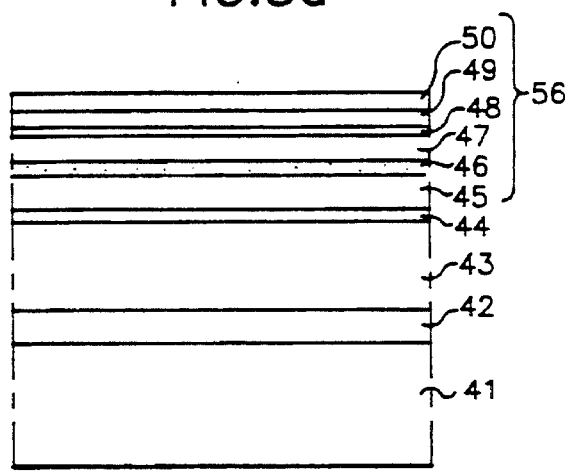
FIGS. 5a to 5g are sectional views respectively illustrating a method for fabricating the semiconductor laser shown in FIG. 4 in accordance with the present invention.

In accordance with this method, first, the buffer layer 42 made of n type GaAs is formed to a thickness of about 0.5 μm over the n type semiconductor substrate 41, as shown in FIG. 5a. Over the buffer layer 42, the first clad layer 43 made of p type In0.5(Ga1−xAlx)0.5P (0.4≦x≦1) is then formed to a thickness of about 1.0 μm. Thereafter, the undoped or p-doped active layer 44 is grown over the first clad layer 43 to a thickness of about 0.05to about 0.2 μm. Over the active layer 44, the second clad layer 56 is then grown. Thus, a DH junction is obtained.

The formation of the second clad layer 56 is achieved by growing the first p type clad layer 45 made of p type In0.5(Ga1−xAlx)0.5P (0.4≦x≦1) to a thickness of about 0.6 μm over the active layer 44, growing the etch stop layer 46 made of p type In0.5Ga0.5P to a thickness of 20 to 100 =521 over the first p type clad layer 45, growing the second p type clad layer 47 made of p type In0.5(Ga1−xAlx)0.5P (0.4≦x≦1) to a thickness of about 0.6 μm over the etch stop layer 46, growing the current injection layer 48 made of p type In0.5Ga0.5P to a thickness of about 0.05 to 1 μm over the second p type clad layer 47, growing the first evaporation-preventing layer 49 made of p type GaAs to a thickness of 0.1 μm over the current injection layer 48, and growing the first evaporation-preventing layer 50 made of p type In0.5Ga0.5P to a thickness of about 0.05 μm over the first evaporation-preventing layer 49.

The growth of the n type buffer layer 42 and the layers constituting the DH structure, that is, the first clad layer 43, the n type active layer 44 and the second clad layer 56 are carried out in a continuous manner in accordance with the primary MOCVD process.

When the second clad layer 56 is subsequently subjected to an etching for forming the mesa-shaped ridge portion thereof, the etch stop layer 46 serves to prevent the first p type clad layer 45 disposed beneath the second clad layer 56.

The current injection layer 48 serves to reduce a high energy band generated between the second clad layer 56 and the cap layer to be subsequently formed so that most of current can flow into the current injection layer.

Figure 5B:
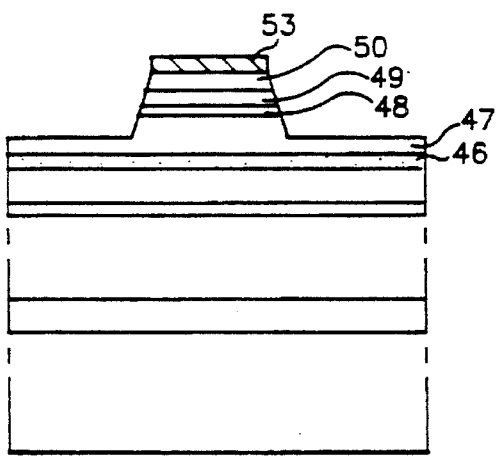
Figure 5C:
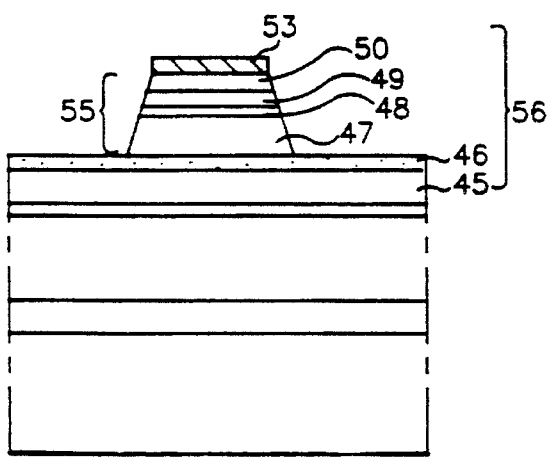

FIGS. 5b and 5c show formation of the mesa-shaped ridge portion of the second clad layer 56.

For formation of the mesa-shaped ridge portion of the second clad layer 56, a photoresist film is first coated over the second clad layer 56. The photoresist film is then subjected to a photo-etching so as to form a photoresist film pattern 53 having a width of 4 to 7 µm only in a region where the mesa-shaped ridge potion is to be formed.

Thereafter, the second evaporation-preventing layer 50, the first evaporation-preventing layer 49, the current injection layer 48 and the second p type clad layer 47 are sequentially etched using an etchant for etching InGaP/GaAs/InGaAlP of the grown layers in a non-selective manner under a condition that the photoresist film pattern 53 is used as a mask.

As shown in FIG. 5b, the second p type clad layer 47 is partially etched to a predetermined depth such that it has an exposed portion.

Using an etchant for etching InGaAlP of the second type clad layer 47 selectively for InGaP of the etch stop layer 46, the exposed portion of the second p type clad layer 47 is completely etched until the etch stop layer 46 is exposed, as shown in FIG. 5c. Thus, the mesa-shaped ridge portion 55 having the width of 4 to 7 µm is formed on the etch stop layer 46.

Figure 5D:
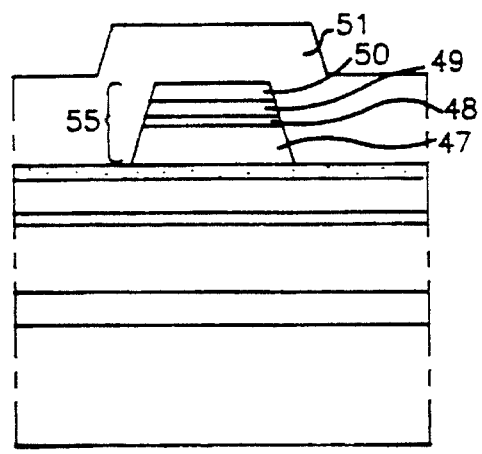

As shown in FIG. 5d, the photoresist film pattern 53 is then removed. Over the entire exposed surface of the resulting structure, the n type current shield layer 51 made of n type GaAs is grown using the secondary MOCVD process to a thickness of 0.8 to 1.0 µm.

The entire surface of the structure exposed upon the growth using the secondary MOCVD process is maintained with P, the Group V element.

In other words, the entire exposed surface exposed upon the growth using the secondary MOCVD process includes the exposed surface of the etch stop layer 46 constituting the second clad layer 56 and made of p type In0.5Ga0.5P and the exposed surface of the second evaporation-preventing layer 50 formed on the mesa-shaped ridge portion 55 of the second clad layer 56 and made of InGaP. Accordingly, the entire exposed surface is maintained with P, the Group V element.

As a result, the second evaporation-preventing layer 50 serves to prevent As of the first evaporation-preventing layer 49 made of GaAs and disposed beneath the second evaporation-preventing layer 50, from being evaporated in a PH3 atmosphere upon the growth using the secondary MOCVD process.

Figure 5E:
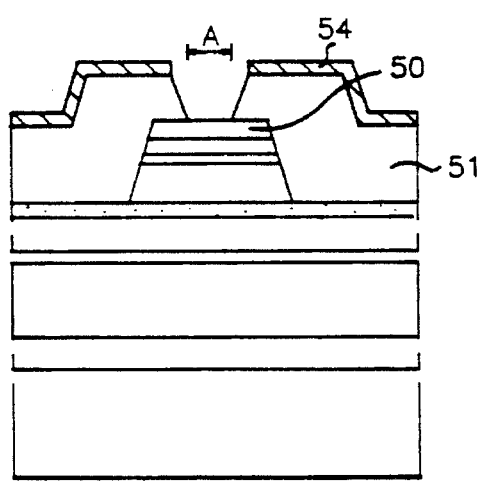

Thereafter, a photoresist film 54 is coated over the n type current shield layer 51 grown by use of the secondary MOCVD process, as shown in FIG. 5e. The photoresist film 54 is then subjected to a photo-etching so as to remove its portion disposed over the mesa-shaped ridge portion 55 of the second clad layer 56. As a result, the current shield layer 51 is partially exposed.

Using the remaining photoresist film 54 as a mask, the exposed portion of current shield layer 51 is etched, thereby forming the current injection region A having a width of 3 to 5 µm at the mesa-shaped ridge portion 55 of the second clad layer 56. In this etching, an etchant is used which is adapted to etch p type GaAs of the current shield layer 51 selectively for p type InGaP of the second evaporation-preventing layer 50.

Figure 5F:
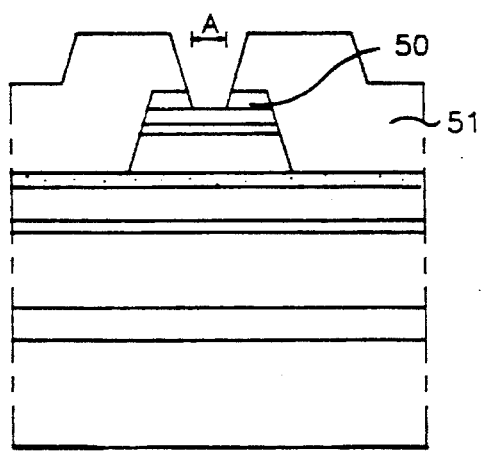

As shown in FIG. 5f, the remaining photoresist film 54 on the second evaporation-preventing layer 50 is then completely removed, thereby exposing the second evaporation-preventing layer 50 made of InGaP and the current shield region 51 made of GaAs. As a result, the entire exposed surface of the resulting structure is not maintained with a single Group V element.

As the etchant for etching p type GaAs of the current shield layer 51 selectively for p type InGaP of the second evaporation-preventing layer 50 is used, the portion of second evaporation layer 50 exposed in the current injection region A upon etching the current shield layer 51 is selectively etched. As a result, the first evaporation-preventing layer 49 made of p type GaAs is exposed in the current injection region A, thereby causing the entire exposed surface of the resulting structure to be maintained with the single Group V element.

Figure 5G:
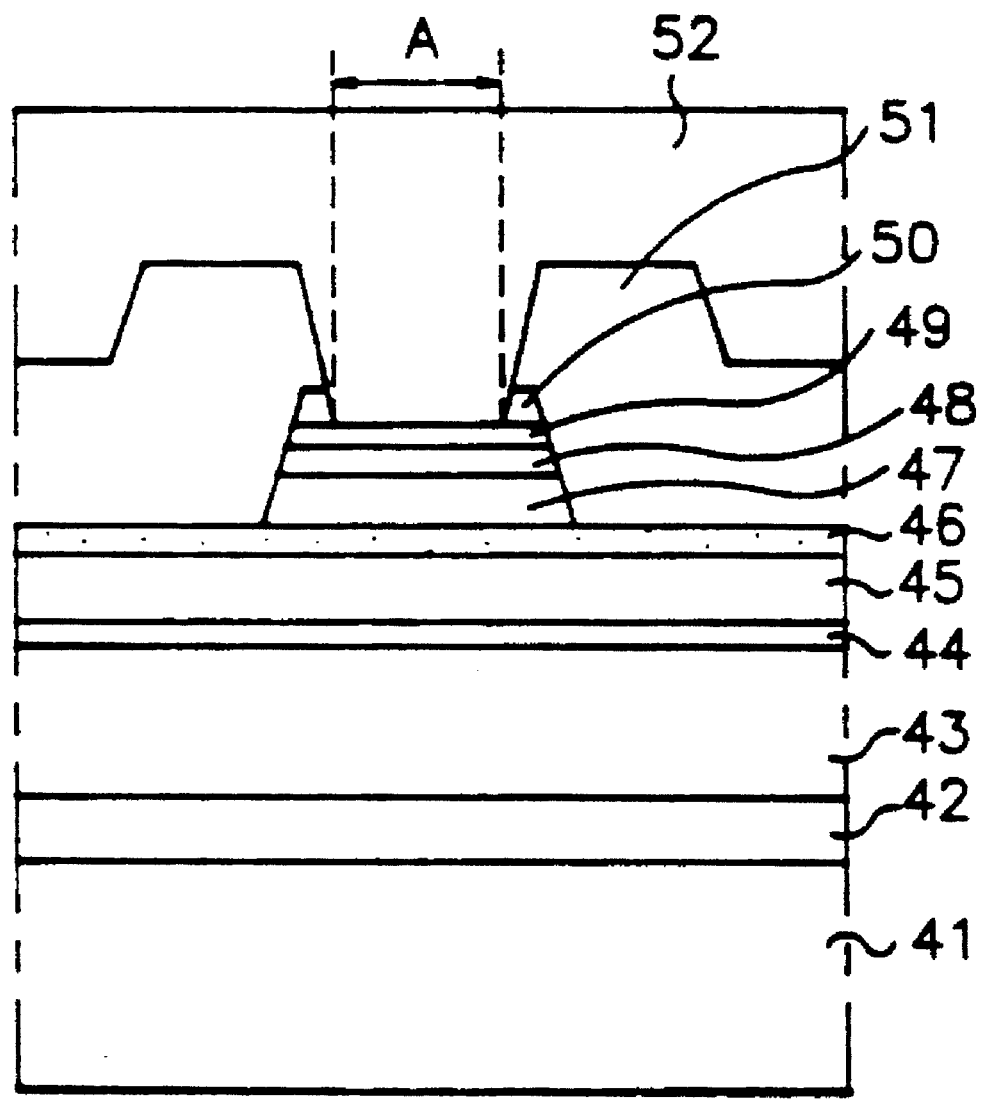

The resulting structure is then loaded in a reactor so as to form the p type GaAs cap layer 52 by use of the third MOCVD process, as shown in FIG. 5g. Finally, a p type electrode (not shown) and an n type electrode (not shown) are deposited over the cap layer 52 and the substrate 41, respectively. Thus, the semiconductor laser shown in FIG. 4 is obtained.

As the thickness of the first p type clad layer 45 disposed beneath the current shield region 51 is adjusted to be small, in accordance with the present invention, it is possible to obtain an effective refractive index difference and thereby realize a refractive waveguide laser diode. Since the etch stop layer 46 has a small thickness not more than 100 Å, its effect on generation of light at the active layer 44 is negligible.

In particular, fabrication of semiconductor lasers exhibiting a superior reliability can be achieved because surfaces exposed upon a continuous MOCVD growth are maintained with a single Group V element in accordance with the present invention, thereby avoiding any defect from being generated at the interface between layers being in contact with each other.

The decreased generation of defect results in an increased use life and improvements in reliability and characteristic. Accordingly, application of laser diodes can be extended.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor laser, comprising the steps of:

forming a buffer layer of a first conduction type over a semiconductor substrate of the first conduction type;

forming a first clad layer of the first conduction type over the buffer layer;

forming an active layer over the first clad layer;

sequentially growing a first second-conduction type clad layer, an etch stop layer, a second second-conduction type clad layer, a current injection layer of the second conduction type, a first evaporation-preventing layer of the second conduction type and a second evaporation-preventing layer of the second conduction type, thereby forming a second clad layer;

etching the second clad layer, thereby forming a mesa-shaped ridge portion;

forming a current shield layer over a portion of the second clad layer exposed upon the etching;

etching a portion of the current shield layer disposed over the mesa-shaped ridge portion, thereby forming a current injection region, and exposing a portion of the second evaporation-preventing layer disposed in the current injection region;

etching the exposed portion of the second evaporation-preventing layer, thereby exposing a portion of the first evaporation-preventing layer disposed beneath the exposed portion of the second evaporation-preventing layer; and forming a cap layer of the second conduction type over the entire exposed surface of the resulting structure.

2. A method in accordance with claim 1, wherein the step of forming the mesa-shaped ridge portion comprises the steps of:

forming a pattern comprised of a photoresist film on the second evaporation-preventing layer;

etching the second evaporation-preventing layer, the first evaporation-preventing layer and the current injection layer under a condition that the photoresist film pattern is used as a mask, and primarily etching the second second-conduction type clad layer to a predetermined depth, thereby partially exposing the second second-conduction type clad layer;

secondarily etching the exposed portion of the second second-conduction type clad layer until the etch stop layer is exposed, thereby forming the mesa-shaped ridge portion; and removing the remaining photoresist film pattern.

3. A method in accordance with claim 2, wherein the step of primarily etching the second second-conduction type clad layer is carried out by using an etchant for etching the second second-conduction type clad layer non-selectively for the first and second evaporation-preventing layers and the current injection layer.

4. A method in accordance with claim 2, wherein the step of secondarily etching the exposed portion of the second second-conduction type clad layer is carried out by using an etchant for etching the second second-conduction type clad layer selectively for the first and second evaporation-preventing layers and the current injection layer.

5. A method in accordance with claim 1, wherein the etch stop layer serves to prevent the first second-conduction type clad layer disposed beneath the second second-conduction type clad layer from being etched upon the etching of the second second-conduction type clad layer and thereby to maintain the thickness of the first second-conduction type clad layer constant.

6. A method in accordance with claim 5, wherein the etch stop layer is formed by growing a p type $In_{0.5}Ga_{0.5}P$ by use of a primary metal organic chemical vapor deposition process.

7. A method in accordance with claim 1, wherein the buffer layer of the first conduction type is formed by growing an n type GaAs doped with an n type impurity in a concentration of 5 to $20\times10^{17}/cm^3$ by use of a primary metal organic chemical vapor deposition process.

8. A method in accordance with claim 1, wherein the first clad layer of the first conduction type is formed by growing an n type $In_{0.5}(Ga_{1-x}Al_x)_{0.5}P$ ($0.4\leq x\leq 1.0$) doped with an n type impurity in a concentration of 1 to $10\times10^{17}/cm^3$ to a thickness of 1.0 μm by use of a primary metal organic chemical vapor deposition process.

9. A method in accordance with claim 1, wherein the active layer is formed by growing one of an undoped $In_{0.5}(Ga_{1-x}Al_x)_{0.5}P$ ($0\leq x\leq 0.5$) and a p type $In_{0.5}(Ga_{1-x}Al_x)_{0.5}P$ ($0\leq x\leq 0.5$) doped with a p type impurity to a thickness of 0.05 to 0.2 μm by use of a primary metal organic chemical vapor deposition process.

10. A method in accordance with claim 1, wherein the first second-conduction type clad layer is formed by growing a p type $In_{0.5}(Ga_{1-x}Al_x)_{0.5}P$ ($0.4\leq x\leq 1.0$) doped with a p type impurity in a concentration of 1 to $10\times10^{17}/cm^3$ to a thickness of 0.2 to 0.3 μm by use of a primary metal organic chemical vapor deposition process.

11. A method in accordance with claim 1, wherein the second second-conduction type clad layer is formed by growing a p type $In_{0.5}(Ga_{1-x}Al_x)_{0.5}P$ ($0.4\leq x\leq 1.0$) doped with a p type impurity in a concentration of 1 to $10\times10^{17}/cm^3$ to a thickness of 0.3 to 0.6 μm by use of a primary metal organic chemical vapor deposition process.

12. A method in accordance with claim 1, wherein the current injection layer serves to decrease an energy band gap generated between the cap layer and the second clad layer.

13. A method in accordance with claim 1, wherein the current injection layer is formed by growing a p type $In_{0.5}Ga_{0.5}P$ to a thickness of 0.05 to 0.1 μm by use of a primary metal organic chemical vapor deposition process.

14. A method in accordance with claim 1, wherein the second evaporation-preventing layer is made of a material containing an element identical to that of the second clad layer which is exposed upon growing the current shield layer.

15. A method in accordance with claim 14, wherein the second evaporation-preventing layer is formed by growing a p type $In_{0.5}Ga_{0.5}P$ doped with a p type impurity in a concentration of 1 to $10\times10^{18}/cm^3$ by use of a primary metal organic chemical vapor deposition process.

16. A method in accordance with claim 1, wherein the first evaporation-preventing layer is made of a material containing an element identical to that of the current shield layer which is exposed upon forming the cap layer.

17. A method in accordance with claim 16, wherein the first evaporation-preventing layer is formed by growing a p type GaAs doped with a p type impurity in a concentration of 1 to $10\times10^{18}/cm^3$ by use of a primary metal organic chemical vapor deposition process.

18. A method in accordance with claim 1, wherein the current shield layer is formed by growing an n type GaAs doped with an n type impurity in a concentration of 1 to $5\times10^{18}/cm^3$ to a thickness of 0.8 to 1.0 μm by use of a secondary metal organic chemical vapor deposition process.

19. A method in accordance with claim 1, wherein the cap layer is formed by growing a p type GaAs by use of a third metal organic chemical vapor deposition process.

20. A method in accordance with claim 1, wherein the step of etching the exposed portion of the second evaporation-preventing layer is carried out by using an etchant for etching the second evaporation-preventing layer selectively for the current shield layer.

* * * * *